United States Patent

Manley et al.

Patent Number: 5,976,943
Date of Patent: Nov. 2, 1999

[54] METHOD FOR BI-LAYER PROGRAMMABLE RESISTOR

[75] Inventors: Martin Harold Manley, Saratoga; Robert Payne, San Jose, both of Calif.

[73] Assignee: VLSI Technology, Inc., San Jose, Calif.

[21] Appl. No.: 08/774,036

[22] Filed: Dec. 27, 1996

[51] Int. Cl.⁶ .................................................. H01L 27/02
[52] U.S. Cl. ........................................... 438/382; 438/238
[58] Field of Search ..................... 438/238–241, 438/130–132, 467, 600–601, 381–382; 257/904, 350, 351, 359, 379, 380, 533

[56] References Cited

U.S. PATENT DOCUMENTS 5,708,291   1/1998   Bohr et al. ............................ 257/529

FOREIGN PATENT DOCUMENTS

WO 97/12401   4/1997   WIPO .

OTHER PUBLICATIONS

Gail Robinson, PROM fuse design scales to sub–0.25 micron, *EE Times*, Sep. 29, 1997.

*Primary Examiner*—Jey Tsai
*Attorney, Agent, or Firm*—Douglas L. Weller

[57] ABSTRACT

A programmable resistor is composed of two layers. A first layer of the programmable resistor has a substantially lower resistance than a second layer of the programmable resistor. The programmable resistor is programmed by placing a signal across the programmable resistor. A resulting current generated by the signal travels in parallel through the first layer of the programmable resistor and the second layer of the programmable resistor. The voltage of the signal is of a sufficient level so that a first portion of the resulting current which travels through the first layer causes a break in the first layer of the programmable resistor. However, the voltage of the signal is not of a sufficient level to allow a second portion of the resulting current which travels through the second layer to cause a break in the second layer of the programmable resistor.

12 Claims, 4 Drawing Sheets

METHOD FOR BI-LAYER PROGRAMMABLE RESISTOR

BACKGROUND

The present invention concerns the design of integrated circuits and pertains particularly to a bi-layer programmable resistor.

There are a significant number of integrated circuit applications that require some sort of electrically programmable memory with the integrated circuit chip. These applications include, for example, applications which require several bits of programmable memory (e.g., programming identification numbers), to applications which require several megabits of programmable memory (e.g., storing operating code).

In the prior art, a wide variety of technologies have been used for implementing programmable memory within integrate circuits. For example, these include floating-gate non-volatile memories and anti-fuses.

One problem with most prior art approaches to providing programmable memory is that extra wafer processing is required to implement them. This increases the product cost. The extra wafer processing is particularly difficult to justify when only relatively small amounts of electrically programmable memory are required on each integrated circuit. It is very advantageous to identify a programmable element that could be produced within the baseline logic integrated circuit process, thus eliminating any additional wafer processing cost.

There have been some attempts to develop programmable elements that can be produced within the baseline logic integrated circuit process. One such "zero-cost" approach that has been used in the past is to create a fuse out of the existing polysilicon or metal layers, and then "blow" the fuse by passing a large programming current. The dissipated heat causes local melting and vaporization of the fuse material, causing the fuse to transition from a relatively low resistance to an open circuit.

There are several significant problems that limit the applicability of the prior art polysilicon or metal fuses. The most fundamental problem is the damage that takes place when the fuse is blown. The blowing of the fuse is usually associated with vaporization of the fuse material, leading to catastrophic rupture of any layers of dielectric or metal that would normally be on top of the fuse in a conventional integrated circuit process. The rupture of the overlying layers represents a significant reliability hazard, as it may cause circuit malfunction directly, or by allowing external contaminants to gain ingress to the integrated circuit. The most common approach to this problem is to create a "passivation opening" over the top of the fuse to ensure that there are no overlying layers present. In this way any vaporized material can escape readily without creating damage. The problem with this approach is that the pad opening destroys the integrity of the overlying "passivation" layer on the die, and so will allow external contaminants to enter the die and cause long-term reliability problems. In practice, when "passivation openings" are used, it is necessary to package the finished product in an expensive "hermetic" package. The package itself will protect the die from external contamination.

There are a couple of other secondary problems that are frequently experienced with polysilicon or metal fuses. The sheet resistance of a doped polysilicon layer is typically in the range 25–60 ohms/square. The power dissipated in the fuse is given by $V^2/R$, where V is the voltage applied to the fuse, and R is the fuse resistance. For typical fuse designs, the voltage V required to generate sufficient heat to destroy the fuse will be higher than the power supplies (2.5–3.3 V) use by advanced integrated circuits. This ensures that an extra programming power supply must be provided, and in some cases, special high voltage transistors must be included in the process to handle this voltage. Such an addition to the process, undercuts the whole aim of adding programmability at no extra wafer processing cost.

Metal fuses have the opposite problem. The sheet resistance of the metal is very low (typically 40–80 milliohms/square), and so the whole fuse will have a resistance of less than an ohm. The voltage required for programming will therefore be very low. However, the power dissipation can be given as $I^2*R$, where I is the current passing through the fuse. Due to the low fuse resistance, a very large programming current will be required to dissipate sufficient power to program the fuse. The programming current must be steered to the required fuse by a series of select transistors. In order to accommodate the very high programming current, these select transistors will need to be very large, hence occupying a significant amount of die area, and increasing product cost.

SUMMARY OF THE INVENTION

In accordance with the preferred embodiment of the present invention, a programmable resistor is presented. The programmable resistor is composed of two layers. A first layer of the programmable resistor has a substantially lower resistance than a second layer of the programmable resistor. The programmable resistor is programmed by placing a signal across the programmable resistor. For example, the signal is a DC signal with a substantially constant voltage. A resulting current generated by the DC signal travels in parallel through the first layer of the programmable resistor and the second layer of the programmable resistor. The constant voltage is of a sufficient level so that a first portion of the resulting current which travels through the first layer causes a break in the first layer of the programmable resistor. However, the constant voltage is not of a sufficient level to allow a second portion of the resulting current which travels through the second layer to cause a break in the second layer of the programmable resistor.

In the preferred embodiment of the present invention, the second layer of the programmable resistor is composed of polysilicon, and the first layer of the programmable resistor is composed of a metal-silicide. For example, in one embodiment of the present invention, the metal-silicide is Tungsten-silicide.

In the preferred embodiment of the present invention, the DC signal is generated by a programming device which has an output resistance which is significantly lower than a resistance across the programmable resistor before the programmable resistor is programmed. The constant voltage is, for example, within a range between 1.2 volts and 3.5 volts, and in a preferred embodiment between 1.7 volts and 2.5 volts.

The present invention provides a structure for a programmable resistor which insures that the resistor will program to a medium resistance state rather than destructively making a transition to an open circuit.

DESCRIPTION OF THE PREFERRED EMBODIMENT

Figure 1:
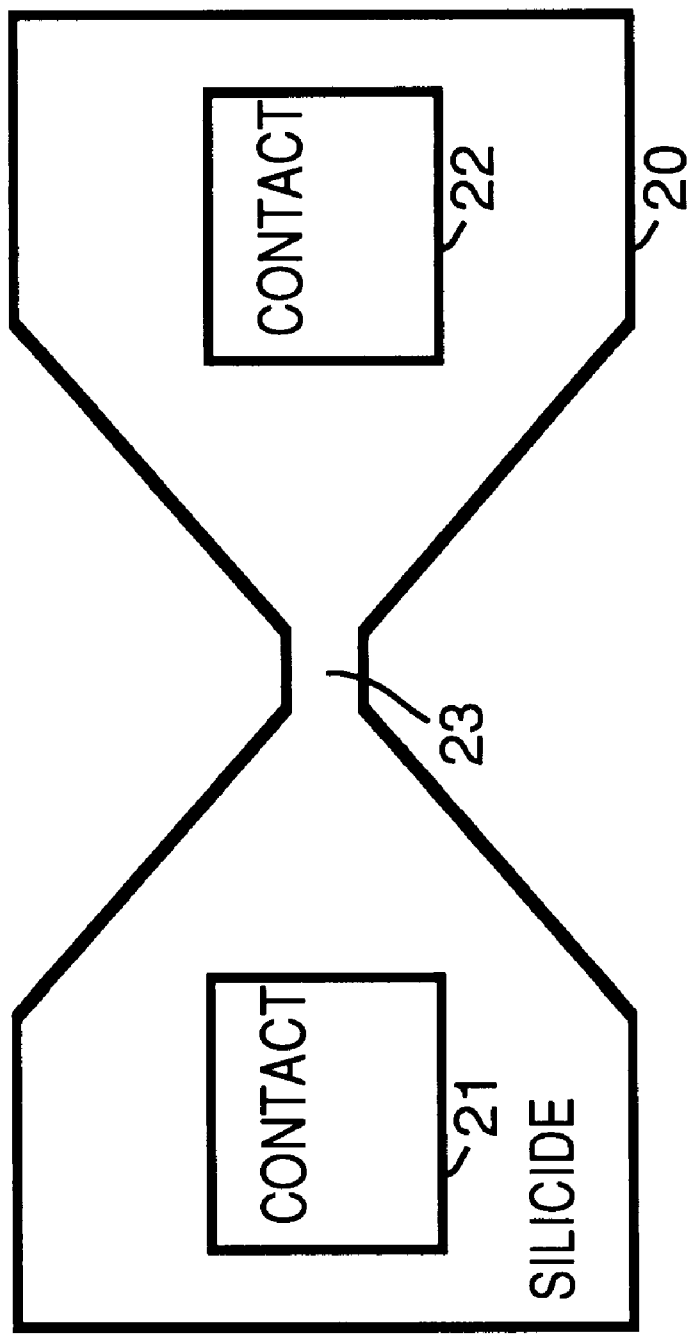
FIG. 1 shows a top view of a bi-layer programmable resistor in accordance with a preferred embodiment of the present invention.

FIG. 1 shows a top view of a programmable resistor in accordance with a preferred embodiment of the present invention. The programmable resistor, when programmed, makes a predicable transition from low resistance to medium resistance. This is in contrast to a regular fuse which becomes an open-circuit after programming.

From the top view, a layer of silicide 20 is shown (Herein, silicide is also referred to as metal-silicide). Silicide layer 20 is the top layer of a bi-layer of material consisting of polysilicon and silicide. A contact 21 and a contact 22 are used to electrically connect the programmable resistor to higher layers.

The programmable resistor is designed to be as small as possible, given the restrictions of the process design rules. This minimizes the thermal mass of the element, and makes it easier to program. The programmable resistor is "necked" down at a region 23 to the minimum width (W) allowed in the design rules. This "necking" down creates localized heating at region 23 by dissipating the majority of the power in a small volume. In a typical CMOS process, the resistance of the bi-layer of silicide and polysilicon layer is typically approximately 10 ohm/square. Thus, the total resistance of the programmable resistor shown in FIG. 1 is, for example, approximately 50 ohm.

Figure 2:
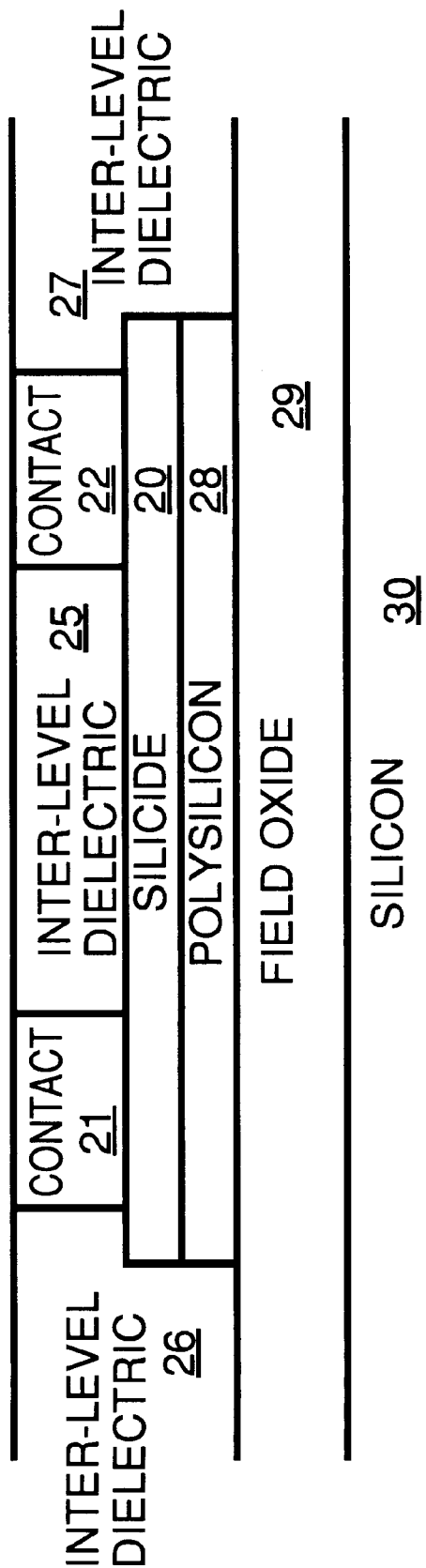
FIG. 2 shows a cross-sectional view of the bi-layer programmable resistor shown in FIG. 1 in accordance with a preferred embodiment of the present invention.

FIG. 2 shows a cross-sectional view of the bi-layer programmable resistor shown in FIG. 1. The programmable resistor is show to be a bi-layer film consisting of moderately low resistance metal-silicide layer 20 on top of a more highly resistive doped polysilicon layer 28. The programmable resistor may be constructed at any point in the processing of an integrated circuit. However, the bi-layer structure used to form the programmable resistor shown in FIG. 1 is commonly used to create the gate electrode in an advanced CMOS process. Thus, in an advanced CMOS process it is advantageous to form the programmable resistor over field oxide 29 placed over a silicon substrate 30. Inter-level dielectric layers 25, 26 and 27 are placed around the programmable resistor in accordance with convention integrated circuit processing steps.

Silicide layer 20 is, for example, Tungsten-Silicide, approximately 1500 Å thick. Alternatively, the metal used for the metal-silicide composition of silicide layer 20 may consist of, for example, Titanium (Ti). Molybdenum (Mo), Chromium (Cr), Nickel (Ni), Cobalt (Co), or Tantalum (Ta). Polysilicon layer 28 is, for example, 1000 Å thick, and doped with Phosphorus.

The sheet resistance of a Tungsten-Silicide layer is, for example, typically 12 ohm/square. By contrast, the resistance of a polysilicon layer is, for example, typically 50 to 100 ohm/square (depending on, among other factors, the doping concentration of the Phosphorous within the polysilicon). Thus, the resistance of the composite of silicide layer 20 and silicide layer 28 is, for example, approximately 10 ohm/square.

Figure 3:
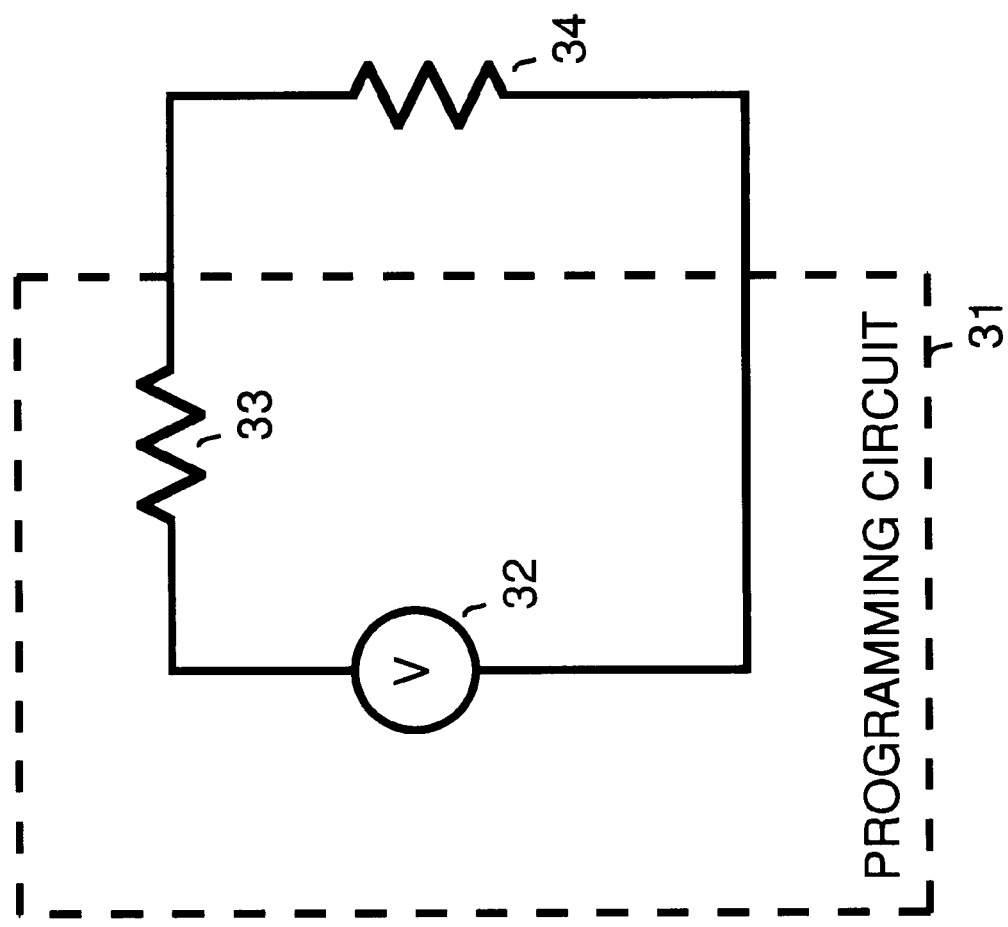
FIG. 3 shows a schematic of a simplified circuit used to program a bi-layer programmable resistor in accordance with a preferred embodiment of the present invention.

FIG. 3 shows a schematic of a simplified programming circuit 31 used to program a bi-layer programmable resistor 34. Programming circuit 31 includes a voltage source 32 and an output impedance (Rp) 33. Voltage source 32 is, for example, the power supply voltage which is, for example, 3.3 volts, 2.5 volts or some other voltage used as a power supply on an integrated circuit. In the preferred embodiment, programming circuit 31 is designed in such a fashion as to maintain the voltage across programmable resistor 34 substantially constant during the programming cycle (as opposed to maintaining the current at a constant level). In order for the voltage across the programmable resistor to remain substantially unchanged during the programming event, output impedance 33 of programming circuit 31 is substantially lower than the initial resistance ($R_f$) of the programmable resistor 34.

For the programmable resistor shown in FIG. 1 and FIG. 2, which has a total resistance of 50 ohms, as discussed above, a programming voltage in the range of 1.7 Volt to 2.7 Volts, is suitable as a programming voltage. This voltage is low in comparison to the operating voltage of even the most advance CMOS integrated circuits, and so presents no special problem in terms of voltage stress on the transistors used in the programming circuitry. In other embodiments of the invention, the range of the programming voltage could be, for example, 1.2 volts to 3.5 volts. As discussed below, experiments have shown that the final resistance of the programmed resistor shown in FIG. 1 and FIG. 2 is substantially constant for programming voltages in the range 1.7–2.7 V and program pulse width over the range 10 ms to 1 sec. Output impedance 33 of programming circuit 31 is, for example, in the range of 10 to 25 ohms.

When programming the programmable resistor, a current of 20–30 milliamps (mA) will flow in the programmable resistor. As the resistance of silicide layer 20 is significantly lower than that of underlying polysilicon layer 28, the bulk of the current will be carried by silicide layer 20, and so the heating effects will be concentrated there. Due to the low thermal mass of the programmable resistor, it heats up quickly. The combination of high temperature and high local current flux in region 23 gives rise to rapid electro-migration effects in the silicide layer 20. At region 23 there is a net flux of silicide transported along the programmable resistor in the direction of electron flow. In a matter of a few milliseconds, the migration of silicide will become so large that a break will occur in silicide layer 20. This break will most typically occur at one end of region 23, where there is a significant change in the rate of material transport.

After the break in silicide layer 20 is created, the programming current will be forced to flow in underlying polysilicon layer 28. This abrupt transition in the current carrying mechanism of the programmable resistor leads to a significant increase in total resistance. The resistance of the programmable resistor will typically change from approximately 50 ohm to approximately 600 ohm:—a factor of twelve increase. Due to the design of programming circuitry 31, as discussed above, the programming voltage across the programmable resistor is maintained substantially constant during this abrupt increase in resistance.

Since the power dissipation in the programmable resistor is equal to the square of the voltage divided by the resistance ($V^2/R$), when the resistance increases by a factor of twelve, the power dissipation will drop by a factor of twelve. The programming current will likewise drop by a factor of twelve. This abrupt decrease in both power dissipation (hence temperature) and programming current will effectively halt the programming mechanism, thus limiting the damage done to the programmable resistor. The final outcome is that the programmable resistor makes a clean transition from a low resistance state to a medium resistance state, without entering into a destructive breakdown mode that is typical of a conventional fuse. As there is no vaporization of the programmable resistor material, the dielectric rupture and reliability problems associated with the prior art fuses are eliminated.

Figure 4:
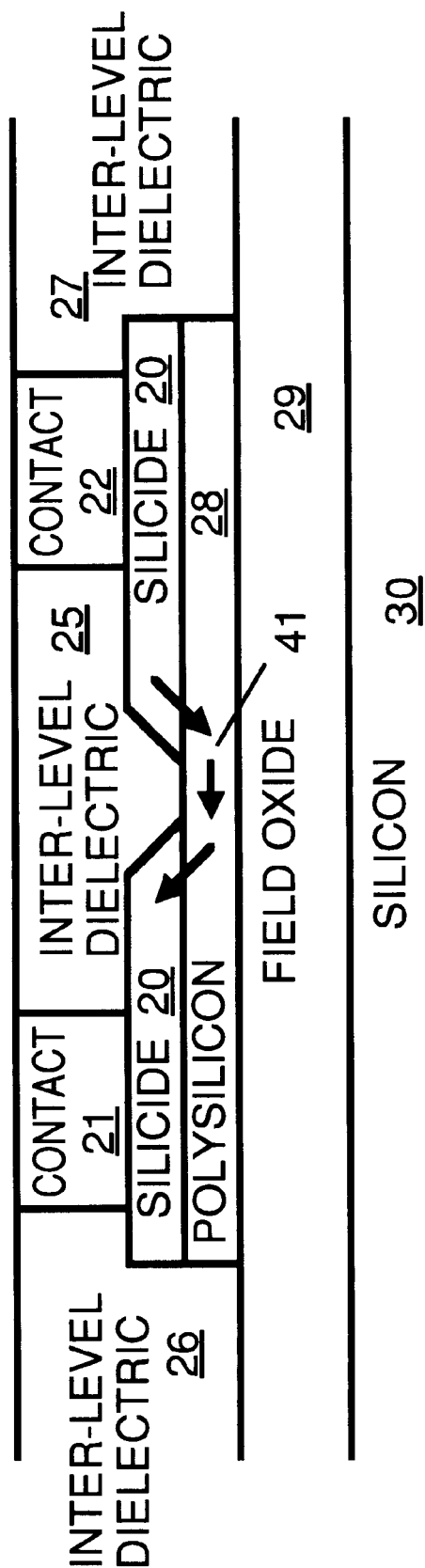
FIG. 4 shows a cross-sectional view of a bi-layer programmable resistor after being programmed in accordance with a preferred embodiment of the present invention.

FIG. 4 shows a cross-sectional view of a bi-layer programmable resistor after being programmed. In FIG. 4, a break is shown in silicide layer 20. As illustrated by arrows 41, at the location of the break in silicide 20, current through the programmable resistor is forced to travel through polysilicon layer 28, thus significantly increasing the resistance of resistor 20.

The final resistance state of the programmable resistor is substantially independent off the programming voltage and the programming time. Experiments have shown that the final resistance of the programmed resistor shown in FIG. 1 and FIG. 2 is substantially constant for programming voltages in the range 1.7–2.7 V and program pulse width over the range 10 ms to 1 sec. The insensitivity to the programming conditions is a direct result of the self-limiting nature of the programming event when a constant voltage programming pulse is applied.

The foregoing discussion discloses and describes merely exemplary methods and embodiments of the present invention. As will be understood by those familiar with the art, the invention may be embodied in other specific forms without departing from the spirit or essential characteristics thereof. For example, while the preferred embodiment of the present invention utilized a programming resistor with composed of a layer of silicide over a layer of polysilicon, it is anticipated that bi-layers of many other types of material may be used to implement a programmable resistor, provided the layers have different resistivity. Accordingly, the disclosure of the present invention is intended to be illustrative, but not limiting, of the scope of the invention, which is set forth in the following claims.

We claim:

1. A method for providing a programmable resistor comprising the following steps:
   (a) constructing a composite bi-layer resistor, a first layer of the bi-layer resistor having a substantially lower resistance than a second layer of the bi-layer resistor; and,
   (b) programming the bi-layer resistor, including the following substep:
      (b.1) placing a signal across the bi-layer resistor, a resulting current generated by the signal traveling in parallel through the first layer of the bi-layer resistor and the second layer of the bi-layer resistor, a voltage of the signal being of a sufficient level so that a first portion of the resulting current which travels through the first layer causes a break in the first layer of the bi-layer resistor, the voltage of the signal not being of a sufficient level to allow a second portion of the resulting current which travels through the second layer to cause a break in the second layer of the bi-layer resistor.

2. A method as in claim 1 wherein step (a) includes the following substeps:
   (a.1) constructing the second layer of polysilicon; and,
   (a.2) constructing the first layer of a metal-silicide.

3. A method as in claim 2 wherein in substep (a.2), the metal-silicide is Tungsten-silicide.

4. A method as in claim 1 wherein in substep (b.1) the DC signal is generated by a programming device which has an output resistance which is significantly lower than a resistance across the programmable resistor before the programmable resistor is programmed in step (b).

5. A method as in claim 1 wherein in substep (b.1) the signal is a DC signal with a constant voltage.

6. A method as in claim 5 wherein in substep (b.1) the constant voltage is within a range between 1.2 volts and 3.5 volts.

7. A method for programming a programmable resistor comprising the following steps:
   (a) placing a signal across the programmable resistor so that a resulting current generated by the signal travels in parallel through a first layer of the programmable resistor and a second layer of the programmable resistor, a voltage of the signal being of a sufficient level so that a first portion of the resulting current which travels through the first layer causes a break in the first layer of the programmable resistor, the voltage of the signal not being of a sufficient level to allow a second portion of the resulting current which travels through the second layer to cause a break in the second layer of the programmable resistor; and,
   (b) removing the signal from across the programmable resistor.

8. A method as in claim 7 wherein in step (a) the second layer comprises polysilicon, and the first layer comprises metal-silicide.

9. A method as in claim 8 wherein in step (a), the metal-silicide is Tungsten-silicide.

10. A method as in claim 7 wherein in step (1) the DC signal is generated by a programming device which has an output resistance which is significantly lower than a resistance across the programmable resistor before the programmable resistor is programmed in step (a).

11. A method as in claim 7 wherein in step (a) the signal is a DC signal with a constant voltage.

12. A method as in claim 11 wherein in step (a) the constant voltage is within a range between 1.2 volts and 3.5 volts.

* * * * *